(12) United States Patent
Ikeda

(10) Patent No.: US 9,087,766 B2
(45) Date of Patent: Jul. 21, 2015

(54) SEMICONDUCTOR HAVING A NORMALLY-ON NITRIDE SEMICONDUCTOR TRANSISTOR AND A NORMALLY-OFF SILICON SEMICONDUCTOR TRANSISTOR PROVIDED ON DIFFERENT METAL SUBSTRATES

(71) Applicant: Kabushiki Kaisha Toshiba, Minato-ku (JP)

(72) Inventor: Kentaro Ikeda, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/206,032

(22) Filed: Mar. 12, 2014

(65) Prior Publication Data

US 2014/0374801 A1 Dec. 25, 2014

(30) Foreign Application Priority Data

Jun. 25, 2013 (JP) .................. 2013-133108

(51) Int. Cl.
*H01L 25/18* (2006.01)
*H01L 23/495* (2006.01)
*H01L 23/62* (2006.01)

(52) U.S. Cl.
CPC .............. *H01L 25/18* (2013.01); *H01L 23/495* (2013.01); *H01L 23/49537* (2013.01); *H01L 23/49575* (2013.01); *H01L 23/62* (2013.01); *H01L 23/49541* (2013.01); *H01L 23/49562* (2013.01); *H01L 23/49568* (2013.01); *H01L 2224/32245* (2013.01); *H01L 2224/45124* (2013.01); *H01L 2224/45144* (2013.01); *H01L 2224/45147* (2013.01); *H01L 2224/48137* (2013.01); *H01L 2224/48195* (2013.01); *H01L 2224/48247* (2013.01); *H01L 2224/48464* (2013.01); *H01L 2224/73265* (2013.01); *H01L 2924/12032* (2013.01); *H01L 2924/13091* (2013.01); *H01L 2924/19107* (2013.01)

(58) Field of Classification Search
None
See application file for complete search history.

(56) References Cited

U.S. PATENT DOCUMENTS

| | | | |
|---|---|---|---|
| 2006/0237825 A1 | 10/2006 | Pavier et al. | |
| 2007/0063216 A1 | 3/2007 | Hu et al. | |
| 2009/0039869 A1 | 2/2009 | Williams | |
| 2011/0101466 A1* | 5/2011 | Wu ............................. | 257/392 |
| 2011/0169549 A1* | 7/2011 | Wu ............................. | 327/434 |
| 2012/0223321 A1 | 9/2012 | Lin et al. | |
| 2012/0241756 A1 | 9/2012 | Zhang et al. | |
| 2012/0256188 A1* | 10/2012 | McDonald et al. ............. | 257/76 |

FOREIGN PATENT DOCUMENTS

JP 2012-212875 11/2012

OTHER PUBLICATIONS

Office Action mailed Jan. 28, 2015 in Korean Application No. 10-2014-0028242 (w/English translation).
Extended European Search Report issued Apr. 2, 2015 in Patent Application No. 14158158.7.

* cited by examiner

*Primary Examiner* — Daniel Luke
(74) *Attorney, Agent, or Firm* — Oblon, McClelland, Maier & Neustadt, L.L.P.

(57) ABSTRACT

A semiconductor device according to one embodiment is provided with a first metal substrate, a second metal substrate separated from the first metal substrate, a normally-off transistor of a silicon semiconductor provided on the first metal substrate, and a normally-on transistor of a nitride semiconductor provided on the second metal substrate.

9 Claims, 8 Drawing Sheets

SEMICONDUCTOR HAVING A NORMALLY-ON NITRIDE SEMICONDUCTOR TRANSISTOR AND A NORMALLY-OFF SILICON SEMICONDUCTOR TRANSISTOR PROVIDED ON DIFFERENT METAL SUBSTRATES

CROSS-REFERENCE TO RELATED APPLICATION

This application is based upon and claims the benefit of priority from Japanese Patent Application No. 2013-133108, filed on Jun. 25, 2013, the entire contents of which are incorporated herein by reference.

FIELD

Embodiments described herein relate generally to a semiconductor device.

BACKGROUND

A group III nitride, for example, GaN (gallium nitride) based nitride semiconductor is expected as a material for a next-generation power semiconductor device. The GaN based semiconductor device has a wide band gap compared to Si (silicon), and can realize a high withstand voltage and a low loss compared to a Si semiconductor device.

A GaN based transistor is generally applied with a high electron mobility transistor (HEMT) structure in which a two-dimensional electronic gas (2DEG) is used as a carrier. A general HEMT is a normally-on transistor which comes to be a conduction state even when a voltage is not applied to a gate. There is a problem in that it is difficult to realize a normally-off transistor which does not come to be the conduction state as long as the voltage is not applied to the gate.

In power circuits handling large power such as several hundreds of voltage to a thousand voltage, a normally-off operation is required for the safety. Therefore, there is proposed a circuit configuration in which a normally-on transistor of a nitride semiconductor and a normally-off transistor of a silicon semiconductor are connected in cascode on the same substrate to realize a normally-off operation.

However, in such a circuit configuration, the heat generated by the normally-on transistor which consumes a large amount of power affects the operation of other elements. Therefore, there is a concern that the characteristics of the circuit may vary.

DETAILED DESCRIPTION

Figure 1:
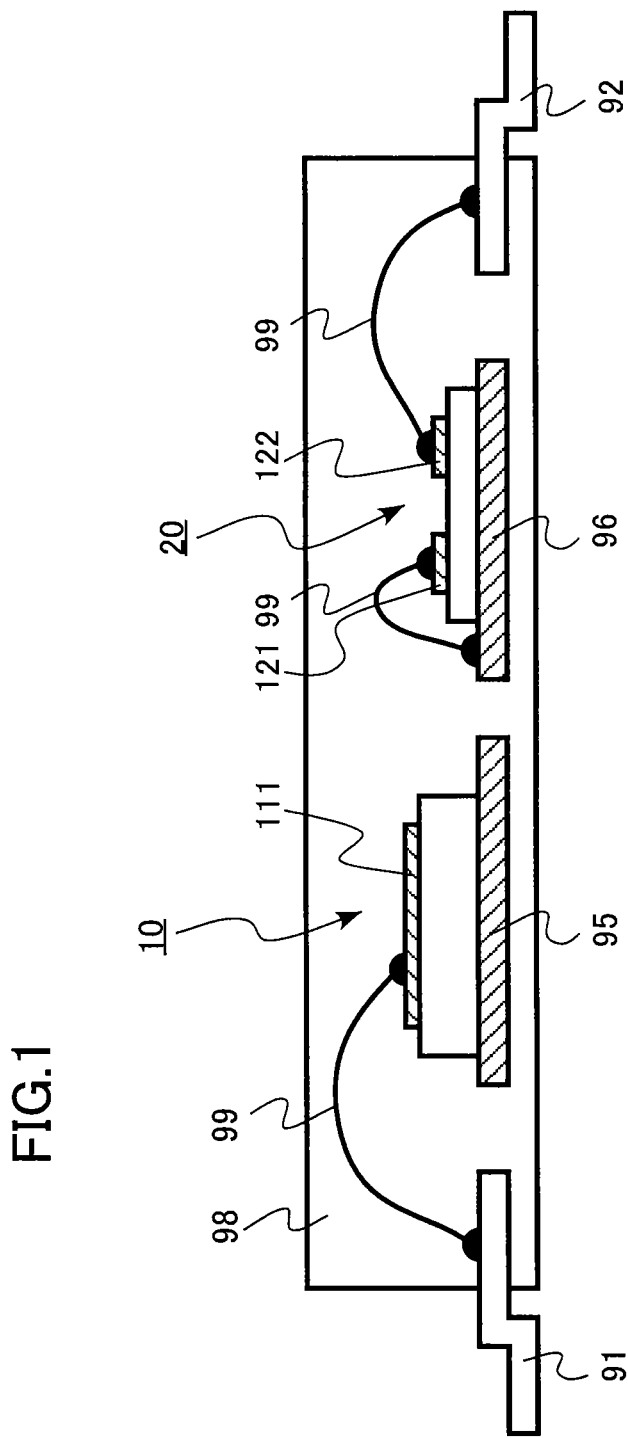
FIG. 1 is a cross-sectional view schematically illustrating a semiconductor device according to a first embodiment.

A semiconductor device according to an embodiment is provided with a first metal substrate, a second metal substrate separated from the first metal substrate, a normally-off transistor of a silicon semiconductor provided on the first metal substrate, and a normally-on transistor of a nitride semiconductor provided on the second metal substrate.

Hereinafter, embodiments will be described with reference to the drawings. Further, in the following descriptions, the same members will be denoted with the same reference numerals, and members once described will not be described again appropriately.

In addition, in the specification, the semiconductor device means a power module in which a plurality of elements such as discrete semiconductors are assembled or an intelligent power module in which the plurality of elements such as the discrete semiconductors are assembled with driving circuits for driving these elements and with self-protecting functions, or includes all the systems which are provided with the power modules and the intelligent power modules.

In addition, in the specification, the normally-on transistor means a transistor in which a channel comes to be in an on state and current flows between the source and the drain when the source and the gate are at the same potential. In addition, in the specification, the normally-off transistor means a transistor in which the channel comes to be in an off state and the current does not flow between the source and the drain when the source and the gate is at the same potential.

In addition, in the specification, the nitride semiconductor is a semiconductor which uses nitride as a group V element among the III-V semiconductors. For example, the nitride semiconductor is a semiconductor which contains GaN (gallium nitride), AlN (aluminum nitride), InN (indium nitride), or an intermediate composition thereof. In addition, a GaN based semiconductor is a generic term referring to the III-V semiconductors including Ga (gallium) as a group III element among the nitride semiconductors.

First Embodiment

A semiconductor device according to the embodiment is provided with a first metal substrate, a second metal substrate separated from the first metal substrate, a normally-off transistor of a silicon semiconductor provided on the first metal substrate, and a normally-on transistor of a nitride semiconductor provided on the second metal substrate.

Figure 2:
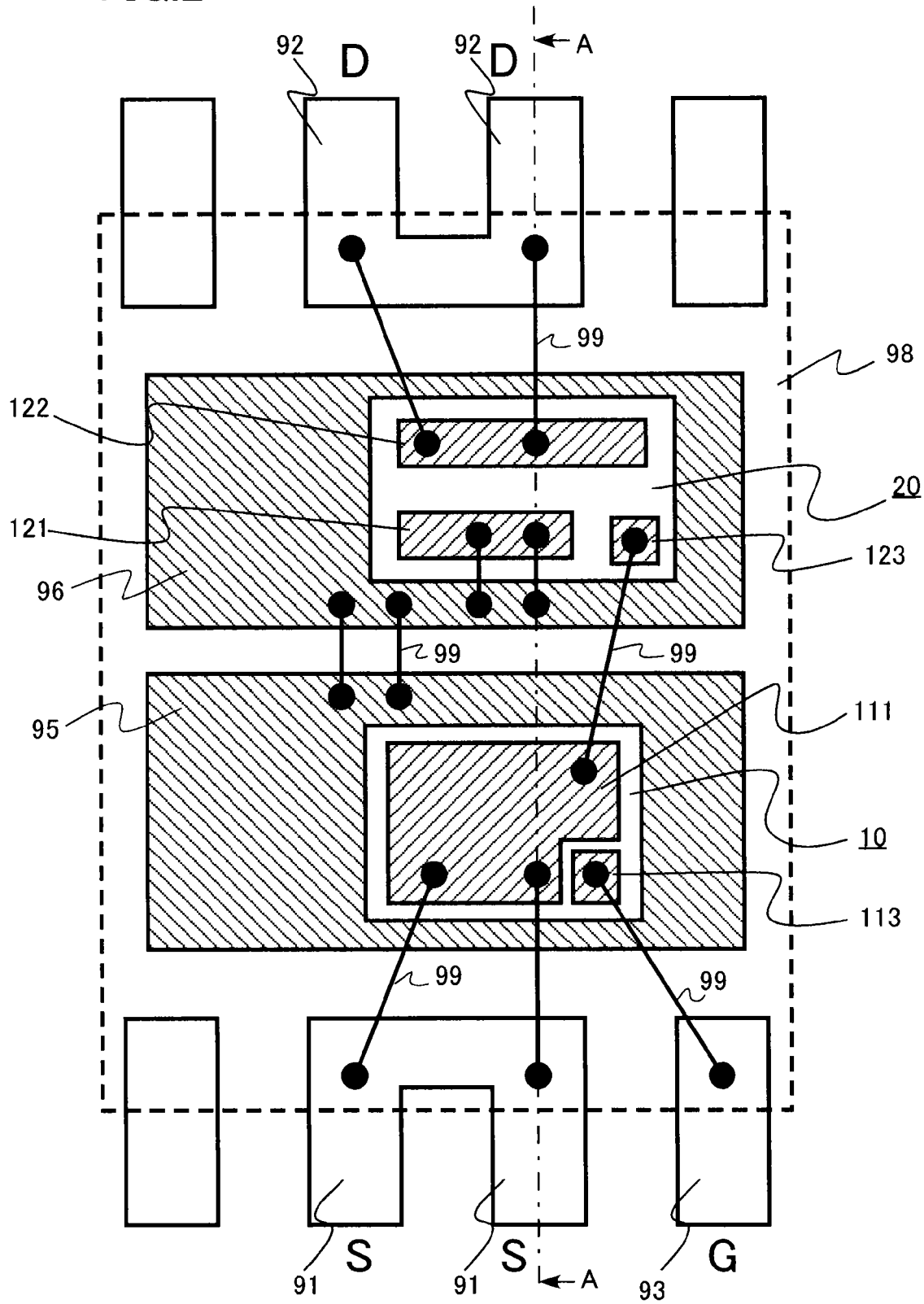
FIG. 2 is a top view schematically illustrating the semiconductor device according to the first embodiment, in which a mold resin is removed.
Figure 3:
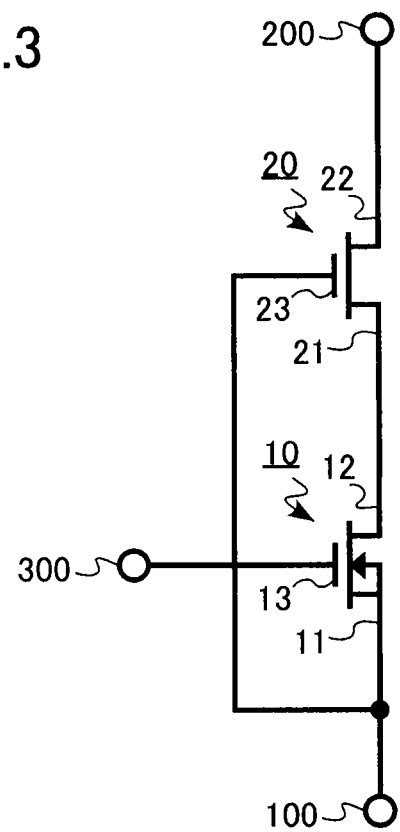
FIG. 3 is a circuit diagram illustrating a semiconductor device according to the first embodiment.

FIG. 1 is a cross-sectional view schematically illustrating the semiconductor device according to the embodiment. FIG. 2 is a top view schematically illustrating the semiconductor device according to the embodiment, in which a mold resin is removed. FIG. 1 is a cross sectional view taken along line A-A of FIG. 2. FIG. 3 is a circuit diagram illustrating the semiconductor device according to the embodiment.

The semiconductor device according to the embodiment is provided with a normally-off transistor 10 formed using the silicon semiconductor and a normally-on transistor 20 formed using the nitride semiconductor. The semiconductor device according to the embodiment is, for example, a power module having a rated voltage of 600 V or 1200 V.

As illustrated in FIG. 3, the semiconductor device according to the embodiment is configured to include the normally-off transistor 10 and the normally-on transistor 20 which are connected in series to form the power module. The normally-off transistor 10 is, for example, a vertical metal oxide semiconductor field effect transistor (MOSFET) formed of Si (silicon). In addition, the normally-on transistor 20 is, for example, a horizontal HEMT formed of GaN (gallium nitride) based semiconductor. The normally-on transistor 20 is provided with a gate insulating film.

The normally-off transistor 10 has a low withstand voltage compared to the normally-on transistor 20. The withstand voltage of the normally-off transistor 10 is, for example, within 10 to 30 V. In addition, the withstand voltage of the normally-on transistor 20 is, for example, within 600 to 1200 V.

The semiconductor device is provided with a source terminal 100, a drain terminal 200, and a gate terminal 300. Then, the normally-off transistor 10 includes a first source 11 connected to the source terminal 100, a first drain 12, and a first gate 13 connected to the gate terminal 300. In addition, the normally-on transistor 20 includes a second source 21 connected to the first drain 12, a second drain 22 connected to the drain terminal 200, and a second gate 23 connected to the source terminal 100.

With such a configuration described above, the semiconductor device according to the embodiment serves as a normally-off transistor which is provided with the source terminal 100, the drain terminal 200, and the gate terminal 300.

As illustrated in FIGS. 1 and 2, the semiconductor device according to the embodiment is provided with a first metal substrate 95 and a second metal substrate 96 physically separated from the first metal substrate 95. The first metal substrate 95 and the second metal substrate 96 are physically separated from each other with a material, which has a thermal conductivity lower than those of the first metal substrate 95 and the second metal substrate 96, interposed therebetween. The first and second metal substrates 95 and 96 are, for example, copper alloys.

Then, the normally-off transistor 10 is provided on the first metal substrate 95, and the normally-on transistor 20 is provided on the second metal substrate 96. The normally-off transistor 10 is, for example, bonded on the first metal substrate 95 using a conductive adhesive such as silver paste. In addition, the normally-on transistor 20 is, for example, bonded on the second metal substrate 96 using a conductive adhesive such as silver paste.

An electrode pad 111 of the first source 11 and an electrode pad 113 of the first gate 13 are provided on the upper face of the normally-off transistor 10. An electrode of the first drain 12 is provided on the lower face of the normally-off transistor 10.

In addition, an electrode pad 121 of the second source 21, an electrode pad 122 of the second drain 22, and an electrode pad 123 of the second gate 23 are provided on the upper face of the normally-on transistor 20.

Then, a source lead 91, a drain lead 92, and a gate lead 93 are further provided. The source lead 91, the drain lead 92, and the gate lead 93 are, for example, copper alloys.

Then, the source lead 91 is electrically connected to the electrode pad 111 of the first source 11, and the drain lead 92 is electrically connected to the electrode pad 122 of the second drain 22. The gate lead 93 is electrically connected to the electrode pad 113 of the first gate 13.

Then, the electrode pad 111 of the first source 11 is electrically connected to the electrode pad 123 of the second gate 23. In addition, the first metal substrate 95 is electrically connected to the second metal substrate 96. Further, the second metal substrate 96 is connected to the electrode pad 121 of the second source 21.

The above-mentioned connections are, for example, made by wire bonding using a bonding wire 99. As the bonding wire 99, for example, materials such as gold (Au), copper (Cu), and aluminum (Al) are used.

Further, the electrode of the first drain 12 disposed on the lower face of the normally-off transistor 10 is electrically connected to the first metal substrate 95 using, for example, a conductive adhesive such as silver paste.

The normally-off transistor 10 and the normally-on transistor 20 are sealed with a mold resin 98 into one body. The mold resin 98 has a thermal conductivity lower than those of the first metal substrate 95 and the second metal substrate 96. The mold resin 98 is, for example, an epoxy resin.

Further, the embodiment has been described as an example in which the normally-off transistor 10 and the normally-on transistor 20 are sealed with the mold resin 98. However, the normally-off transistor 10 and the normally-on transistor 20 may not be necessarily sealed with the mold resin 98. For example, the first metal substrate 95 and the second metal substrate 96 are provided on the same ceramic substrate, and the normally-off transistor 10 and the normally-on transistor 20 may be configured to be filled with the air therebetween.

At the time when the power module according to the embodiment operates, a heating value significantly increases in the normally-on transistor 20 of the nitride semiconductor having large power consumption more than in the normally-off transistor 10. Then, the normally-off transistor 10 of the silicon semiconductor has less resistance against heat compared to the normally-on transistor 20 of the nitride semiconductor. In other words, an increase in the leakage current caused by the temperature rise and a variation in the threshold are remarkable in the normally-off transistor 10 compared to the normally-on transistor 20. In addition, also a temperature resulting in the element destruction is low compared to the normally-on transistor 20.

In the embodiment, the first metal substrate 95 to be mounted by the normally-off transistor 10 and the second metal substrate 96 to be mounted by the normally-on transistor 20 are physically separated through a material having a low thermal conductivity. With this configuration, the normally-off transistor 10 is thermally separated from the normally-on transistor 20, so that a thermal influence due to the heat generated by the normally-on transistor 20 is suppressed from affecting the normally-off transistor 10. Therefore, the semiconductor device which has less characteristics variation and high reliability is realized.

In the embodiment, the thermal conductivity of the second metal substrate 96 is desirably smaller than that of the first metal substrate 95. With this configuration, the heat of the normally-on transistor 20 is suppressed from being transferred into the second metal substrate 96. Therefore, it is possible to further suppress the thermal influence due to the heat generated by the normally-on transistor 20 from affecting the normally-off transistor 10.

In addition, in the embodiment, the first metal substrate 95 is electrically connected to the first drain 12, and the second metal substrate 96 is electrically connected to the second source 21. In other words, the second metal substrate 96 and the second source 21 have the same potential. Then, the second metal substrate 96 is disposed over an area from the second source 21 to the second drain 22 on the lower face of the normally-on transistor 20.

Therefore, the second metal substrate 96 serves as a source field plate of the normally-on transistor 20. The source field plate weakens the electric field in a source region and a drain region between the second source 21 and the second drain 22, and suppresses current collapse.

As described above, with the semiconductor device according to the embodiment, the semiconductor device which has less characteristics variation and high reliability is realized by thermally separating the normally-off transistor 10 from the normally-on transistor 20. In addition, with the semiconductor device according to the embodiment, the current collapse is suppressed by making the second metal substrate 96 serve as the source field plate, and thus the semiconductor device having high reliability is realized.

Second Embodiment

A semiconductor device according to the embodiment is different from the first embodiment in that the second metal substrate is electrically connected to the second drain. A redundant description overlapping the first embodiment will be omitted.

Figure 4:
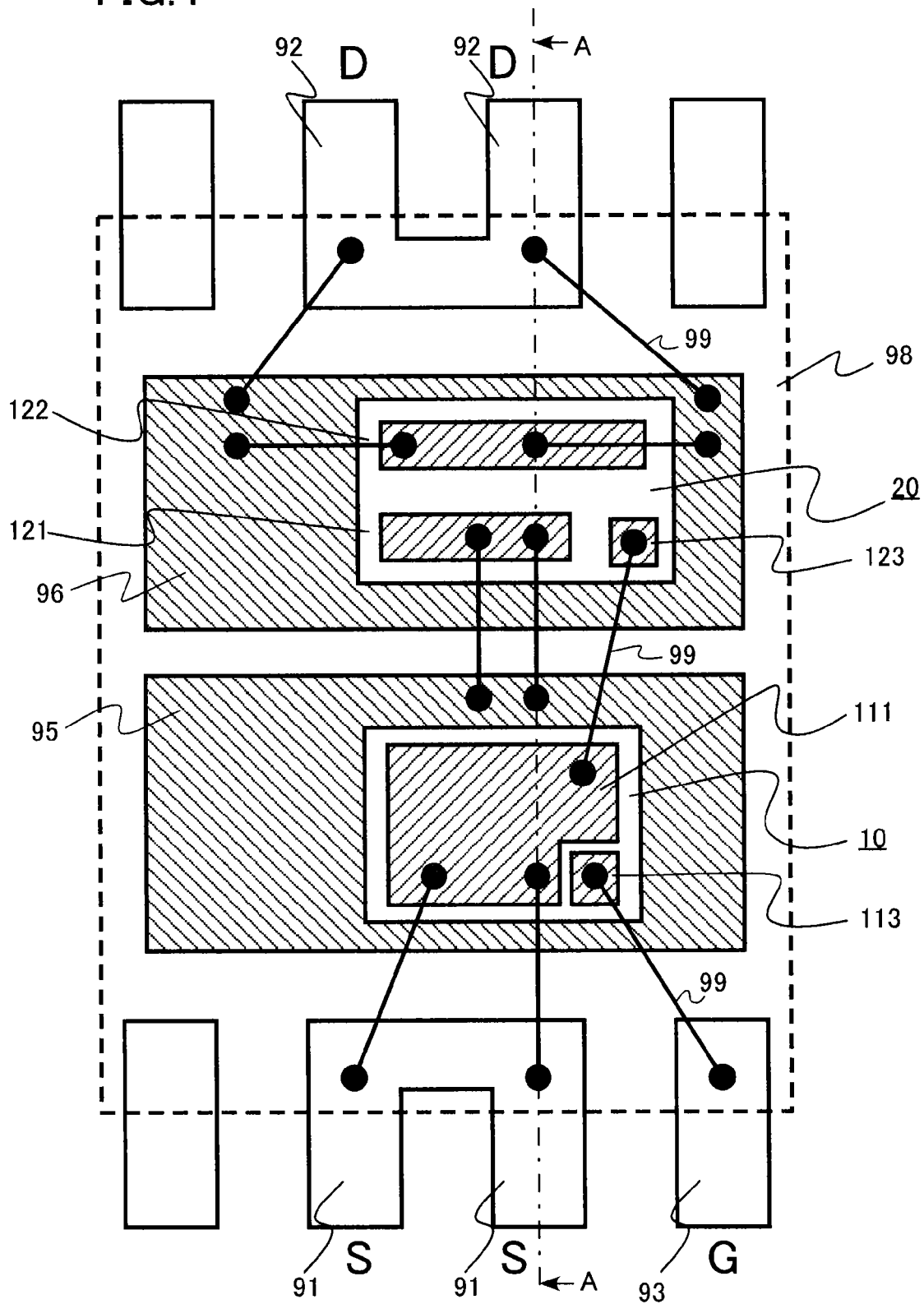
FIG. 4 is a top view schematically illustrating a semiconductor device according to a second embodiment, in which a mold resin is removed.

FIG. 4 is a top view schematically illustrating the semiconductor device according to the embodiment, in which a mold resin is removed. The circuit configuration according to the embodiment is similar to the circuit configuration according to the first embodiment illustrated in FIG. 3.

In the embodiment, the source lead 91 is electrically connected to the electrode pad 111 of the first source 11, and the drain lead 92 is electrically connected to the second metal substrate 96. The gate lead 93 is electrically connected to the electrode pad 113 of the first gate 13.

Then, the electrode pad 111 of the first source 11 is electrically connected to the electrode pad 123 of the second gate 23. In addition, the first metal substrate 95 is electrically connected to the electrode pad 121 of the second source 21. Further, the electrode pad 122 of the second drain 22 is electrically connected to the second metal substrate 96.

Further, the electrode of the first drain 12 disposed on the lower face of the normally-off transistor 10 is electrically connected to the first metal substrate 95 using, for example, a conductive adhesive such as silver paste.

In the embodiment, similarly to the first embodiment, the normally-off transistor 10 is thermally separated from the normally-on transistor 20, so that the thermal influence due to the heat generated by the normally-on transistor 20 is suppressed from affecting the normally-off transistor 10. Therefore, the semiconductor device which has less characteristics variation and high reliability is realized.

In addition, in the embodiment, unlike the first embodiment, the second metal substrate 96 has no electrical connection directly to the first drain 12 and the second source 21. In other words, the second metal substrate 96 is not electrically connected directly to the normally-off transistor 10 and a connection portion of the normally-on transistor 20 (hereinafter, simply referred to as a connection portion).

There is a concern that the second metal substrate 96 acts as an antenna, which is parasitic on the semiconductor device during a period when the semiconductor device operates. In other words, there is a concern that the second metal substrate 96 gathers noises outside the semiconductor device to cause an unstable operation of the semiconductor device. On the contrary, there is a concern that the second metal substrate 96 transmits noise from the semiconductor device to the outside of the semiconductor device to cause an adverse influence on elements outside the semiconductor device. Therefore, in particular, there is a strong concern that the operations of the elements become unstable when the second metal substrate 96 is connected to the connection portion and the like which are not fixed in potential.

In the embodiment, the second metal substrate 96 is fixed at a drain voltage through the connection to the drain lead 92. Therefore, it is suppressed that the second metal substrate 96 acts as an antenna to affect the operation of the semiconductor device itself or the elements outside the semiconductor device.

In general, the second metal substrate 96 on which the normally-on transistor 20 having a large heating value is mounted is connected to a large-area heat sink or the like compared to the first metal substrate 95. For this reason, the surface area of the conductor acting as a parasitic antenna is easily increased. Therefore, fixing the potential of the second metal substrate 96 having a large surface area to the drain voltage is effective for the noise suppression.

Further, as described in the embodiment, the potentials of the first metal substrate 95 and the second metal substrate 96 can be differently set by physically separating the first metal substrate 95 from the second metal substrate 96.

As described above, with the semiconductor device according to the embodiment, the semiconductor device which has less characteristics variation and high reliability is realized by thermally separating the normally-off transistor 10 from the normally-on transistor 20. In addition, the semiconductor device which operates stably and does not make an adverse influence on the surrounding elements is realized by fixing the second metal substrate 96 at the drain voltage.

Third Embodiment

A semiconductor device according to the embodiment is different from the first embodiment in that there is further provided a diode on the first metal substrate. A redundant description overlapping the first embodiment will be omitted.

The diode according to the embodiment is a zener diode.

Figure 5:
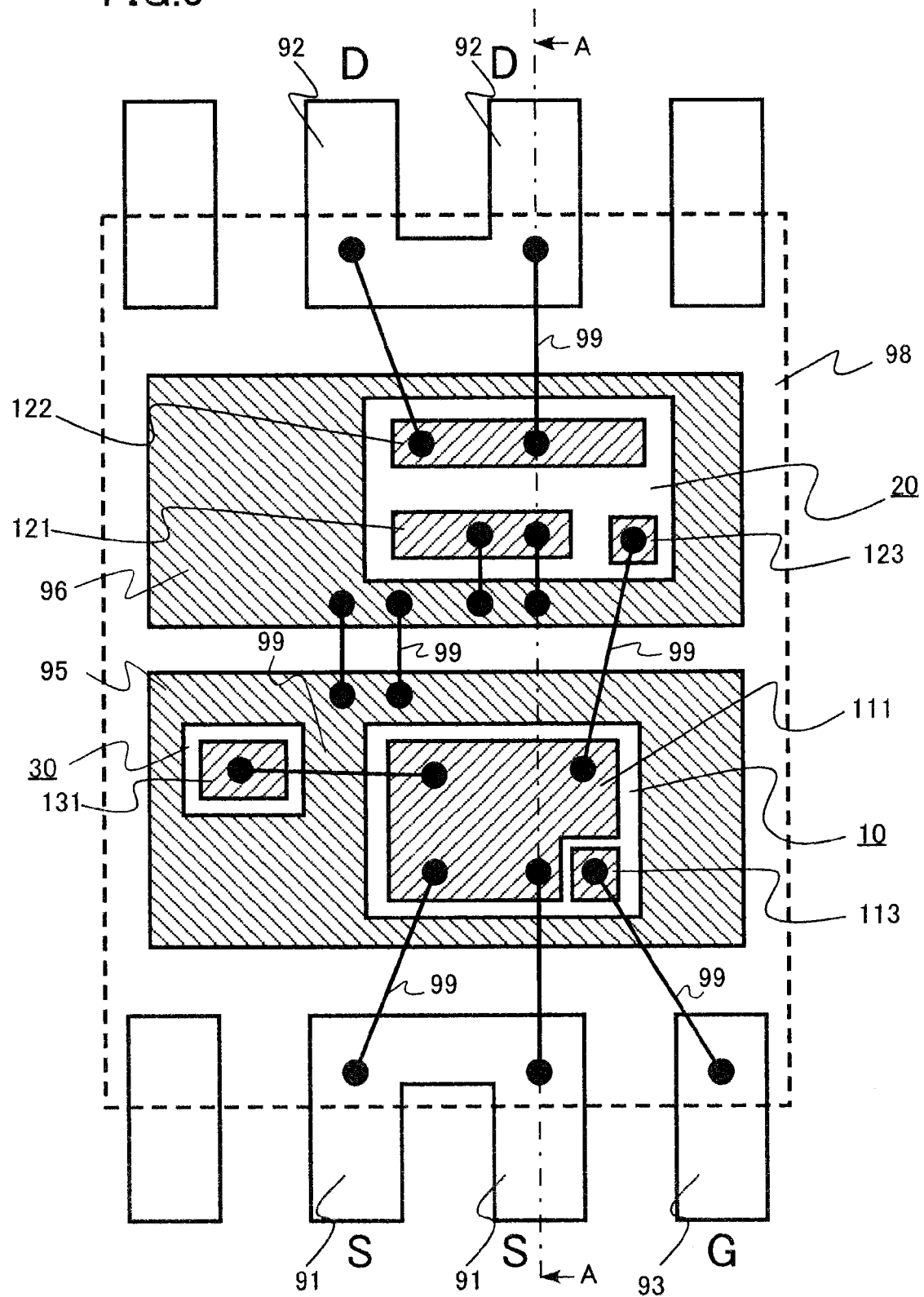
FIG. 5 is a top view schematically illustrating a semiconductor device according to a third embodiment, in which a mold resin is removed.
Figure 6:
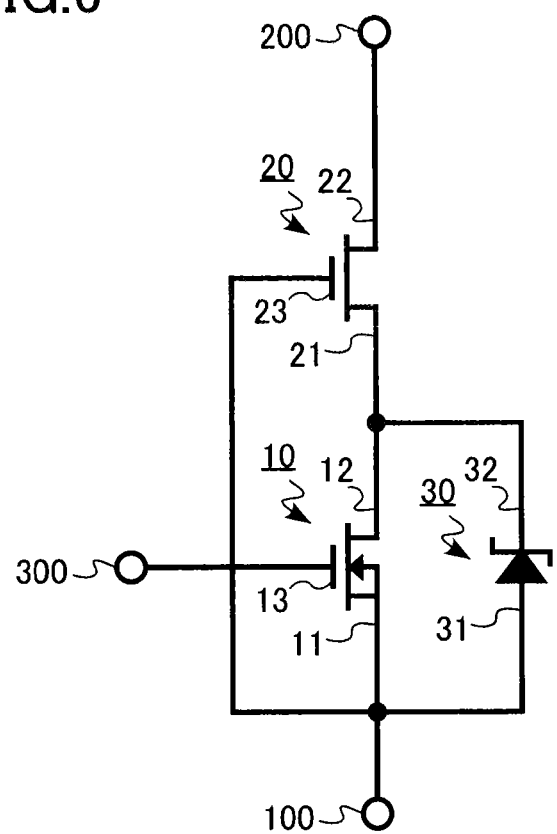
FIG. 6 is a circuit diagram illustrating the semiconductor device according to the third embodiment.

FIG. 5 is a top view schematically illustrating the semiconductor device according to the embodiment, in which a mold resin is removed. FIG. 6 is a circuit diagram illustrating the semiconductor device according to the embodiment. The semiconductor device according to the embodiment is provided with, for example, a zener diode 30 made of the silicon semiconductor in parallel with the normally-off transistor 10.

As illustrated in FIG. 6, the zener diode 30 includes a first anode 31 and a first cathode 32. The first anode 31 is connected to the first source 11. In addition, the first cathode 32 is connected to the first drain 12 and the second source 21.

Herein, a zener voltage of the zener diode 30 is set to be lower than an avalanche breakdown voltage of the normally-off transistor 10. In addition, the zener voltage is set to be lower than a withstand voltage of the gate insulating film of the normally-on transistor 20. With this configuration, the withstand voltage between the first source 11 and the first drain 12 at the time of turning off the normally-off transistor 10 becomes lower than the withstand voltage between the second source 21 and the second gate 23 of the normally-on transistor 20.

As illustrated in FIG. 5, an electrode pad 131 of the first anode 31 is provided on the upper face of the zener diode 30. Then, the electrode pad 111 of the first source 11 and the electrode pad 131 of the first anode 31 are electrically connected, for example, through the bonding wire 99.

In addition, an electrode of the first cathode 32 is provided on the lower face of the zener diode 30. Then, the lower face of the zener diode 30 is electrically connected to the first metal substrate 95 using, for example, a conductive adhesive such as silver paste.

Then, a distance between the zener diode 30 and the normally-on transistor 20 is longer than that between the normally-off transistor 10 and the normally-on transistor 20. Herein, a distance between two elements means the shortest distance between the two elements.

In a circuit configuration in which the normally-off transistor 10 and the normally-on transistor 20 are connected in series, there is a concern that an overvoltage is generated during the operation in a connection portion between the normally-off transistor 10 and the normally-on transistor 20. For example, when the semiconductor device transitions from the on state to the off state, a high voltage applied between the source terminal 100 and the drain terminal 200 is divided at the ratio of parasitic capacitances of the normally-off transistor 10 and the normally-on transistor 20, so that the overvoltage may be generated. Alternatively, when the semiconductor device is turned off, the high voltage applied between the source terminal 100 and the drain terminal 200 is divided at the ratio of leakage currents of the normally-off transistor 10 and the normally-on transistor 20, so that the overvoltage may be generated.

When the overvoltage is generated, the high voltage is applied between the second source 21 and the second gate 23 of the normally-on transistor 20. When the overvoltage becomes equal to or higher than the withstand voltage of the gate insulating film, there is a concern that the leakage current of the gate insulating film of the normally-on transistor 20 is increased or the gate insulating film is broken down. When the leakage current of the gate insulating film of the normally-on transistor 20 is increased or the gate insulating film is broken down, the semiconductor device malfunctions. Therefore, the semiconductor device is reduced in reliability.

In addition, even in a case where there is no problems in the gate insulating film, when the high voltage is applied between the second source 21 and the second gate 23 of the normally-on transistor 20, electric charges are trapped in the second source 21. For this reason, a current collapse may be caused. When the current collapse occurs, the on-state current is reduced to result in malfunction. Therefore, the semiconductor device is also reduced in reliability.

In the semiconductor device according to the embodiment, in a case where the overvoltage is generated in the connection portion between the normally-off transistor 10 and the normally-on transistor 20, the electric charges escape to the zener diode 30 and are pulled out to the source terminal 100 at the time when the overvoltage reaches the zener voltage. Therefore, a voltage rise in the connection portion is suppressed, and an increase in the leakage current of the gate insulating film of the normally-on transistor 20 and the breakdown of the gate insulating film are prevented. In addition, the current collapse is also prevented. Therefore, the semiconductor device is improved in reliability.

In addition, even in a case where an unexpected high voltage such as noises or the like is applied to the first drain 12 of the normally-off transistor 10, the electric charges can escape through the zener diode 30. Therefore, the semiconductor device will also contribute to the protection of the normally-off transistor 10.

In general, the zener diode 30 has less resistance against heat compared to the normally-on transistor 20 of the nitride semiconductor. In other words, an increase in the leakage current caused by the temperature rise and the characteristics variation such as a variation in the zener voltage are remarkable in the zener diode 30. In addition, a temperature resulting in the element destruction is also low compared to the normally-on transistor 20.

In the embodiment, the first metal substrate 95 to be mounted by the zener diode 30 and the second metal substrate 96 to be mounted by the normally-on transistor 20 are physically separated through a material having a low thermal conductivity. With this configuration, the zener diode 30 is thermally separated from the normally-on transistor 20, so that a thermal influence due to the heat generated by the normally-on transistor 20 is suppressed from affecting the zener diode 30. Therefore, the semiconductor device which has less characteristics variation and high reliability is realized.

In general, the zener diode 30 is less resistant against heat compared to the normally-off transistor 10 of the silicon semiconductor. In other words, an increase in the leakage current caused by the temperature rise and the characteristics variation such as a variation in the zener voltage are remarkable in the zener diode 30 compared to the normally-off transistor 10. In addition, a temperature resulting in the element destruction is also low compared to the normally-off transistor 10.

In the embodiment, a distance between the zener diode 30 and the normally-on transistor 20 is longer than that between the normally-off transistor 10 and the normally-on transistor 20. With this configuration, the temperature rise of the zener diode 30 is suppressed lower than that of the normally-off transistor 10. Therefore, the thermal influence due to the heat generated by the normally-on transistor 20 is suppressed from affecting the zener diode 30. Therefore, the semiconductor device which has less characteristics variation and higher reliability is realized.

As described above, with the semiconductor device according to the embodiment, an advantage that the resistance is improved in a case where the overvoltage is generated in the connection portion is obtained in addition to the advantage of the first embodiment. In addition, an advantage of suppressing the current collapse is also obtained. Then, since the zener diode 30 is thermally separated from the normally-on transistor 20, the characteristics variation due to the heat is also suppressed. Therefore, the semiconductor device which has less characteristics variation and higher reliability is realized.

Fourth Embodiment

A semiconductor device according to the embodiment is different from the third embodiment in that there is further provided a schottky-barrier diode on the first metal substrate. A redundant description overlapping the first and third embodiments will be omitted.

Figure 7:
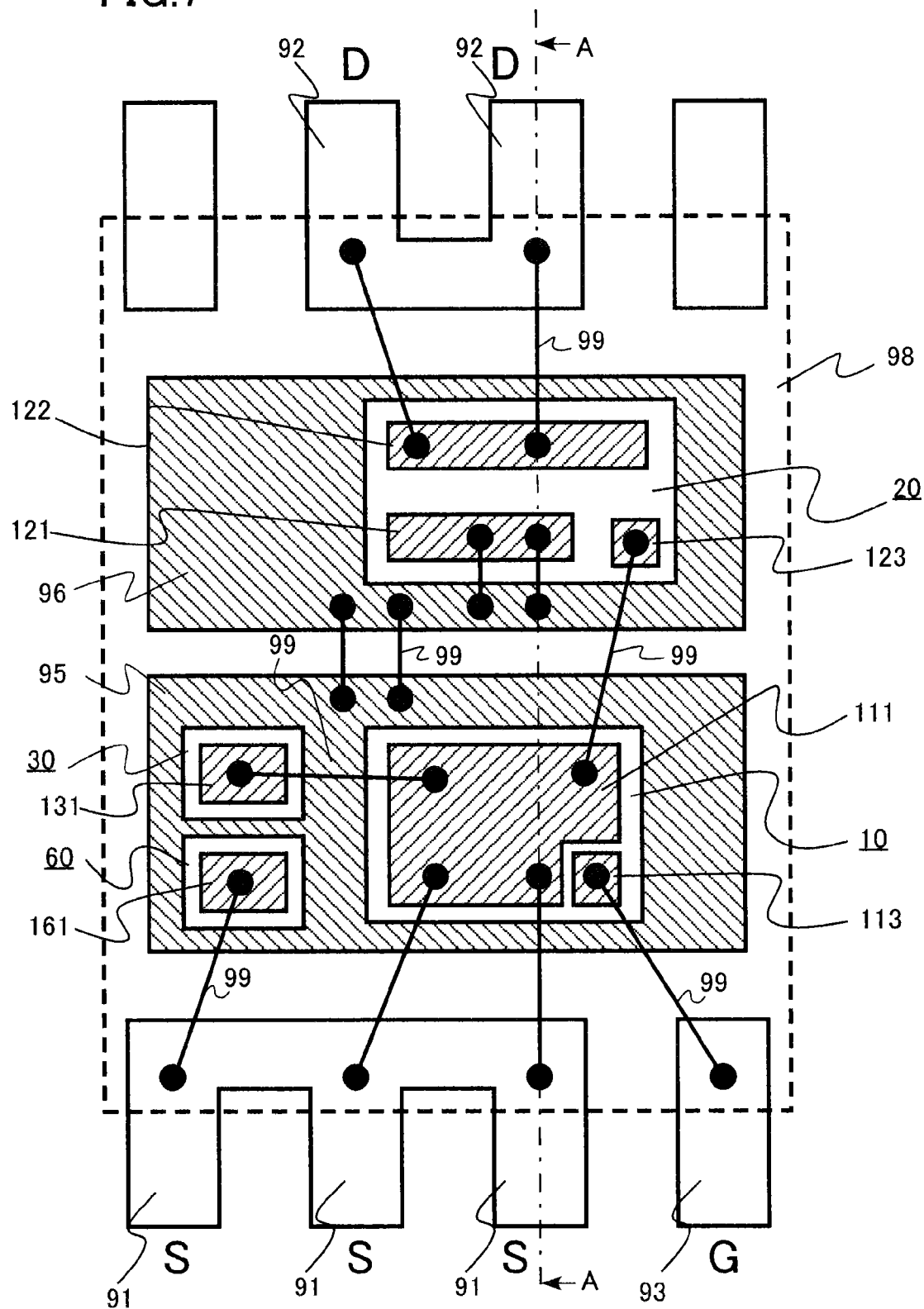
FIG. 7 is a top view schematically illustrating a semiconductor device according to a fourth embodiment, in which a mold resin is removed.
Figure 8:
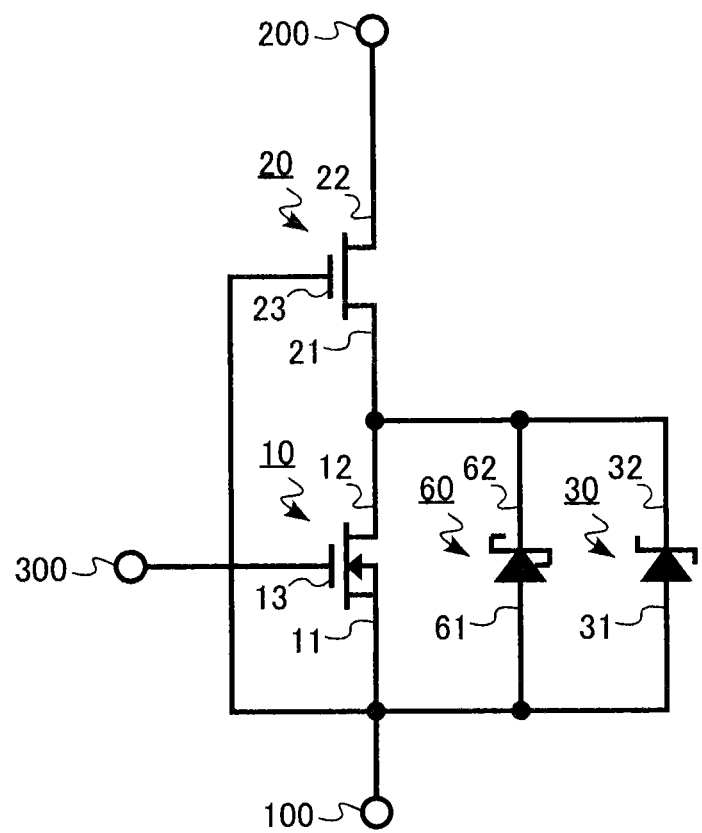
FIG. 8 is a circuit diagram illustrating a semiconductor device according to the fourth embodiment.

FIG. 7 is a top view schematically illustrating the semiconductor device according to the embodiment, in which a mold resin is removed. FIG. 8 is a circuit diagram illustrating the semiconductor device according to the embodiment.

The semiconductor device according to the embodiment is provided with the zener diode 30 and a schottky-barrier diode 60 in parallel with the normally-off transistor 10.

As illustrated in FIG. 8, the zener diode 30 includes the first anode 31 and the first cathode 32. The first anode 31 is connected to the first source. In addition, the first cathode 32 is connected to the first drain 12 and the second source 21.

In addition, the schottky-barrier diode 60 is provided with a second anode 61 and a second cathode 62. Then, the second anode 61 is connected to the first source 11. In addition, the second cathode 62 is connected to the first drain 12 and the second source 21.

A forward drop voltage (Vf) of the schottky-barrier diode 60 is lower than a forward drop voltage (Vf) of a parasitic body diode (not illustrated) of the normally-off transistor. Then, the schottky-barrier diode 60 is provided between the first drain 12 and the second source 21, and the first source 11 in parallel with the zener diode 30.

As illustrated in FIG. 7, an electrode pad 161 of the second anode 61 is provided on the upper face of the schottky-barrier diode 60. Then, the source lead 91 is electrically connected to the electrode pad 161 of the second anode 61 using, for example, the bonding wire 99.

In addition, an electrode of the second cathode 62 is provided on the lower face of the schottky-barrier diode 60. Then, the lower face of the schottky-barrier diode 60 is electrically connected to the first metal substrate 95 using, for example, a conductive adhesive such as silver paste.

Then, a distance between the zener diode 30 and the normally-on transistor 20 and a distance between the schottky-barrier diode 60 and the normally-on transistor 20 are longer than that between the normally-off transistor 10 and the normally-on transistor 20.

In a case where the schottky-barrier diode 60 is not provided, the current flows through a parasitic body diode of the normally-off transistor 10 in a reflux mode in which the source terminal 100 becomes positive in voltage with respect to the drain terminal 200. In the embodiment, there is provided the schottky-barrier diode 60 of which the forward drop voltage (Vf) is lower than the forward drop voltage (Vf) of the parasitic body diode of the normally-off transistor 10. Therefore, the current flows through the schottky-barrier diode 60 in the reflux mode.

The schottky-barrier diode operates only using a number of carriers unlike a PIN diode. Therefore, the schottky-barrier diode has an excellent recovery characteristic compared to the PIN diode. Therefore, the recovery characteristic can be improved in the reflux mode. Accordingly, it is possible to realize the semiconductor device which is excellent in the reliability and the recovery characteristic. Since the greater part of the withstand voltage is burdened on the normally-on transistor 20, the schottky-barrier diode 60 can be selected among diode products having a low withstand voltage. With this configuration, it is possible to achieve a body diode operation of a high withstand voltage while maintaining the same forward drop voltage (Vf) characteristic and the same recovery characteristic as the low withstand voltage product.

In addition, since the forward drop voltage (Vf) is small, the conduction loss and the switching loss can also be reduced in the reflux mode. In addition, the overvoltage is suppressed from being applied to the connection portion by a parasitic capacitance of the schottky-barrier diode 60. In addition, since the electric charges can escape from the connection portion by the leakage current of the schottky-barrier diode 60, the overvoltage is suppressed from being applied to the connection portion. Therefore, the semiconductor device more improved in reliability is realized.

Further, since the schottky-barrier diode 60 has no guarantee against the avalanche, the withstand voltage of the schottky-barrier diode 60 is desirably higher than the avalanche breakdown voltage of the normally-off transistor 10.

In general, the schottky-barrier diode 60 has less resistance against heat compared to the normally-on transistor 20 of the nitride semiconductor. In other words, an increase in the leakage current caused by the temperature rise and the characteristics variation such as a variation in the zener voltage are remarkable in the schottky-barrier diode 60. In addition, also a temperature resulting in the element destruction is low compared to the normally-on transistor 20.

In the embodiment, the first metal substrate 95 to be mounted by the schottky-barrier diode 60 and the second metal substrate 96 to be mounted by the normally-on transistor 20 are physically separated through a material having a low thermal conductivity. With this configuration, the schottky-barrier diode 60 is thermally separated from the normally-on transistor 20, so that a thermal influence due to the heat generated by the normally-on transistor 20 is suppressed from affecting the zener diode 30.

In general, the schottky-barrier diode 60 has less resistance against heat compared to the zener diode 30. In other words, an increase in the leakage current caused by the temperature rise and the characteristics variation are remarkable in the schottky-barrier diode 60 compared to the zener diode 30.

In the embodiment, a distance between the schottky-barrier diode 60 and the normally-on transistor 20 which serves as a main heat source is longer than that between the zener diode 30 and the normally-on transistor 20. Therefore, it is possible to reduce an influence on the schottky-barrier diode 60 due to the temperature rise. Therefore, the semiconductor device which has less characteristics variation and high reliability is realized.

As described above, with the semiconductor device according to the embodiment, an advantage that the resistance is improved in a case where the overvoltage is generated in the connection portion is obtained in addition to the advantages of the first and third embodiments. In addition, an advantage of suppressing the current collapse is also obtained. Further, the recovery characteristic can be improved in the reflux mode. In addition, since the zener diode 30 and the schottky-barrier diode 60 are thermally separated from the normally-on transistor 20, the characteristics variation due to the heat is also suppressed. Therefore, the semiconductor device which has less characteristics variation and higher reliability is realized.

Further, the embodiment has been described about the circuit configuration in which the normally-off transistor of the silicon semiconductor and the normally-on transistor of the nitride semiconductor are connected in series. However, as long as the normally-off transistor of the silicon semiconductor and the normally-on transistor of the nitride semiconductor are mounted on different metal substrates, the circuit configuration is not necessarily limited to the embodiment.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first metal substrate;
a second metal substrate separated from the first metal substrate;
a normally-off transistor formed of silicon semiconductor and provided on the first metal substrate; and
a normally-on transistor formed of nitride semiconductor and provided on the second metal substrate,
wherein
the normally-off transistor includes a first source connected to a source terminal, a first drain, and a first gate connected to a gate terminal,
the normally-on transistor includes a second source connected to the first drain, a second drain connected to a drain terminal, and a second gate connected to the source terminal,
the first metal substrate is electrically connected to the first drain, and the second metal substrate is electrically connected to the second source.

2. The device according to claim 1, wherein the normally-on transistor is an HEMT formed of GaN based semiconductor.

3. The device according to claim 1, wherein the normally-off transistor is a vertical MOSFET.

4. The device according to claim 1, wherein
a material having thermal conductivity smaller than thermal conductivity of both of the first metal substrate and the second metal substrate is provided between the first metal substrate and the second metal substrate.

5. A semiconductor device comprising:
a first metal substrate;
a second metal substrate separated from the first metal substrate;
a normally-off transistor formed of silicon semiconductor and provided on the first metal substrate; and
a normally-on transistor formed of nitride semiconductor and provided on the second metal substrate, wherein
thermal conductivity of the second metal substrate is smaller than thermal conductivity of the first metal substrate.

6. The device according to claim 1, further comprising a diode provided on the first metal substrate.

7. The device according to claim 6, wherein
a distance between the diode and the normally-on transistor is longer than a distance between the normally-off transistor and the normally-on transistor.

8. The device according to claim 6, wherein
the diode is a zener diode.

9. The device according to claim 6, wherein
the diode is a schottky-barrier diode.

* * * * *